United States Patent [19]

Nishino et al.

[11] Patent Number: 4,694,573
[45] Date of Patent: Sep. 22, 1987

[54] METHOD OF FORMING ELECTRICALLY CONDUCTIVE CIRCUIT

[75] Inventors: Atsushi Nishino, Neyagawa; Masaki Ikeda, Hirakata; Yoshihiro Watanabe, Moriguchi; Masahiro Hiraka, Hirakata, all of Japan

[73] Assignee: Matsushita Electric Industrial Co., Ltd., Osaka, Japan

[21] Appl. No.: 832,716

[22] PCT Filed: Jun. 12, 1985

[86] PCT No.: PCT/JP85/00327
§ 371 Date: Feb. 10, 1986
§ 102(e) Date: Feb. 10, 1986

[87] PCT Pub. No.: WO86/00190
PCT Pub. Date: Jan. 3, 1986

[30] Foreign Application Priority Data

Jun. 14, 1984 [JP] Japan ................................. 59-120648

[51] Int. Cl.[4] .............................................. H05K 3/20
[52] U.S. Cl. ..................................... 29/846; 156/150; 264/61
[58] Field of Search ................... 29/846, 848; 156/150; 264/61

[56] References Cited

U.S. PATENT DOCUMENTS 3,729,819  5/1973  Horie .................................. 29/846 X
3,870,776  3/1975  McMahon .
4,587,402  5/1986  Nishino et al. .

FOREIGN PATENT DOCUMENTS 51-11160  1/1976  Japan .

Primary Examiner—Howard N. Goldberg
Assistant Examiner—Carl J. Arbes
Attorney, Agent, or Firm—Stevens, Davis, Miller & Mosher

[57] ABSTRACT

Disclosed is a method of forming an electrically conductive circuit comprising the steps of: preparing a transferring paper in which an assembly of electrically conductive foil carrying a predetermined pattern and an insulating layer containing glass frit and an overcoat layer consisting of a resin film having good burning property are provided on a transferring paper covered with a paste layer; removing an integral structure of the conductive foil, the insulating layer, and the overcoat layer from the transferring paper; transferring the removed integral structure onto a substrate; and burning the substrate with the integral structure set thereon at a temperature where the glass is soften. According to this method, it is possible to eliminate transformation or damage of a conductive foil where a conductive foil is singly disposed on a substrate.

10 Claims, 7 Drawing Figures

List of reference numerals in the attached figures.

1 ..... Metal substrate

2 ..... Enamel layer

3 ..... Electroconductive foil 4,5 ... Vitreous insulation layer

4',5' . Insulation layer forming material layer

6 ..... Paper for printing

7 ..... Adhesive layer

8 ..... Resin layer

METHOD OF FORMING ELECTRICALLY CONDUCTIVE CIRCUIT

BACKGROUND OF THE INVENTION

1. Field of the Invention

The present invention relates to a method of forming an electrically conductive (hereinafter simply referred to "conductive") circuit by fixing a thin metal belt having a predetermined pattern onto a surface of an insulating substrate such as a metal substrate, an enameled substrate, or the like, and particularly to a method of forming a conductive circuit or a plate heating unit circuit which is required to conduct a large current.

2. Description of the Prior Art

Conventionally, typical conductive circuit boards have been formed in such a manner that copper foil having about 5 to 15 $\mu m$ of thickness bonded onto the surface of an insulating substrate made of such as phenolic resin, epoxy resin containing glass fibers, or the like, was etched to form a predetermined conductive circuit. The circuit substrate of this kind is small in size, light in weight, inexpensive in cost, and has been used in various kinds of electric apparatuses.

However, it becomes necessary to conduct a microcurrent not larger than 1 $\mu A$ in the case where an IC, an LSI circuit, or the like, is employed on the circuit board, while it is required to conduct an instantaneous large current if an IC, an LSI circuit, or the like, is used in an automatic focusing circuit, a motor driving circuit, a stroboscopic lamp circuit, or the like, in an electronic camera, a VTR camera, or the like. That is, it is necessary to form a given one of various circuits which are different from each other in level of current over eight digits, that is, over a range form about 0.5 $\mu A$ to 10A, on the same circuit board, so that it is impossible to ensure formation of a highly accurate conductive circuit on such a circuit board as described above.

Although making the thickness of the copper foil thicker to be within a range from about 50 to 150 $\mu m$ has been tried in order to overcome the above disadvantage, a problem occurs in that it takes a long time for etching the copper foil having such thickness so that protrusions are remarkably caused particularly at the corner portions of a circuit due to a phenomenon of overhanging, under-cutting and therefore it is impossible to maintain an accurate circuit resistance. Accordingly, in order to obtain a circuit pattern which can endure various levels of currents, from a micro one to a large one, it is necessary to employ a method of punching correctly a thin copper belt having a relatively large thickness by using a press.

Further WO No. 84/00275 discloses a plate heating unit in which a heating element consisting of conductive foil having a predetermined pattern is fixed and covered with an enamel layer on a surface of an enameled substrate. It is convenient to produce the heating element to be used in the heating unit of this kind by punching metal foil by a press.

In the case of forming, by punching, conductive foil having a predetermined pattern for constituting a conductive circuit for such an electronic apparatus or for heating units as described above, it is required to provide means for maintaining the conductive foil in its predetermined shape in order to prevent the conductive foil from being locally transformed or injured in handling the conductive foil to store the same, to displace the same, positioning the same on the substrate, etc., during a period until the conductive foil has been fixed on the substrate.

SUMMARY OF THE INVENTION

An object of the present invention is to solve the above-mentioned problems as to circuit boards.

Another object of the present invention is to provide a method of forming a conductive circuit by fixing conductive foil having a predetermined pattern on a substrate without being transformed.

Still another object of the present invention is to provide a method of forming a conductive circuit which can endure conduction of a large current and in which thermal transformation or the like is never generated.

Further object of the present invention is to provide a method of forming an enamel layer and a conductive circuit at the same time on a metal substrate.

Still further object of the present invention is to provide a method of easily forming a conductive circuit covered partially or wholly with an enamel layer on an enameled substrate.

According to one aspect of the present invention, the method of forming an electrically conductive circuit comprising the steps of: preparing a transferring paper in which an assembly of electrically conductive foil carrying a predetermined pattern and an insulating layer containing glass frit and an overcoat layer consisting of a resin film having good burning property are provided on a transferring mount paper covered with a soluble paste layer; removing an integral structure of the assembly of the conductive foil, the insulating layer, and the overcoat layer from the transferring paper; setting the removed integral structure onto a substrate with the overcoat layer outside; firing the substrate with the integral structure set thereon to burn out the resin film and simultaneously to soften the glass in the insulating layer, forming a material layer to form a vitreous enamel insulating layer.

In the assembly of the conductive foil and the insulating layer, the insulating layer may be formed between the paste layer and the conductive foil and/or between the conductive foil and the overcoat layer. In the case the insulating layer is provided between the paste layer and the conductive foil, a metal substrate may be used as the substrate.

Preferably, the paste layer is soluble paste layer.

According to the method of the present invention, a conductive foil is not handled singly but fixed and stored on a paper so as to be handled integrally with an insulating layer and a resin film in setting onto a substrate so that the conductive foil can be fixed onto the substrate while maintaining its predetermined pattern without being transformed or damaged.

The above and other objects and features of the invention will appear more fully hereinafter from a consideration of the following description taken in connection with the accompanying drawings.

BEST MODE FOR CARRYING OUT THE INVENTION

Figure 1:
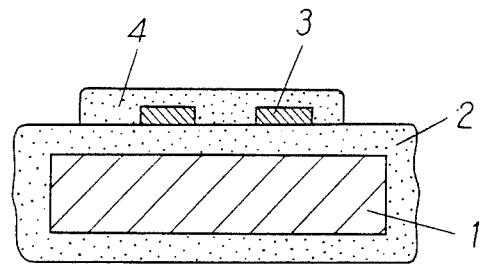
FIGS. 1 and 2 are longitudinal cross-sections each showing an arrangement of an example of a substrate on which a conductive circuit is formed by a method according to the present invention.

FIG. 1 shows an embodiment of a substrate on which a conductive circuit is formed according to the present invention. In the drawing, the reference numeral 1 designates a metal substrate, 2 an enamel layer covering the surface of the metal substrate 1, 3 conductive foil having a predetermined pattern, and 4 a vitreous enamel insulating layer covering the conductive foil to fix the same on the enamel layer 2.

Figure 2:
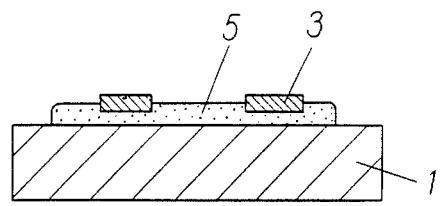

FIG. 2 shows an example in which a vitreous enamel insulating layer 5 and conductive foil 3 are integrally formed on a metal substrate 1.

Figure 3:
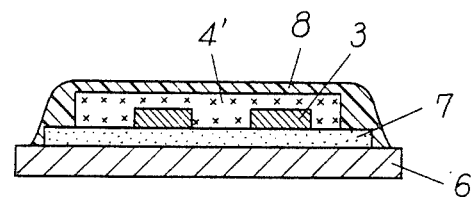
FIGS. 3, 4, and 5 are longitudinal cross-sections each showing an arrangement of an example of a transferring paper.
Figure 4:
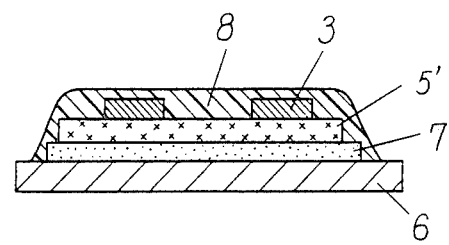
Figure 5:
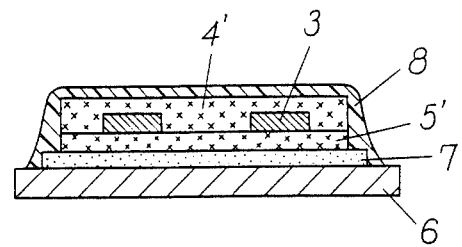

FIGS. 3 to 5 show examples of arrangement of transferring paper. FIG. 3 shows an example in which a paste layer 7, conductive foil 3, an insulating layer forming material layer 4', and a resin film 8 forming an overcoat layer are formed on a transferring mount paper 6. A transfer section separated from the mount paper at a portion of the paste layer 7, that is, an integrated body including the conductive foil 3, the layer 4', the resin film 8 is put on the enamel layer 2 of the enameled substrate with the conductive foil 3 inside and fired at a temperature at which glass contained in the layer 4' is fused to thereby obtain such a conductive circuit board as shown in FIG. 1. The layer 4 is formed from the layer 4'.

FIG. 4 shows an example in which a paste layer 7, an insulating layer 5', conductive foil 3, and a resin film 8 are formed on a mount paper 6. A transfer section in the example, that is, an integrated body including the layer 5', the conductive foil 3, and the resin film 8 is put on a metal substrate 1 and fired in the same manner as the former example the thereby obtain such a conductive circuit board as shown in FIG. 2. In this case, because the metal substrate 1 is used, it is necessary to use glass having sufficiently large insulating capability in an insulating layer 5.

FIG. 5 shows an example in which insulating layer forming material layers 4' and 5' are provided on both the upper and lower surfaces of conductive foil 3.

Next, a process of manufacturing the transferring paper and constituent elements of the same used in the present invention will be described.

(1) Process of Manufacturing Transferring Paper

At first, as the thin conductive belt for forming a circuit, there are two possibilities, one being where a thin conductive belt punched out by a press can be used as it is, the other being where a first pattern is formed and then the first pattern is once transferred onto a sheet of resin such as acrylic resin and then laminated, and a minute circuit pattern is formed in a second pattern forming to thereby obtain a desired circuit pattern. The latter process is suitable for obtaining a circuit pattern for a VTR camera, an electronic camera, or the like, while the former simple process is suitable for obtaining a relatively large circuit pattern such as a plate heating unit.

Next, referring to FIG. 5, a process of manufacturing the transferring paper will be described. The paste layer 7 is formed by screen-printing on the transferring mount paper by using a soluble paste layer and dried at 25° to 45° C. The insulating layer 5' is formed on the paste layer 7 by screen-printing. The thickness of the insulating layer 5' can be adjusted within a range from 5 to 200 $\mu$m by selecting the mesh of screen in accordance with the purpose. After drying the layer 5' at 25° to 45° C., the conductive foil 3 having a predetermined pattern is set on the layer 5'. Then, the insulating layer 4' is provided and then the resin film 8 is provided as an overcoat layer. The resin film 8 is formed by spraying a solution of resin or by screen-printing. Further, pressing is performed for correcting the circuit pattern according to demand.

Although the process of manufacturing the transferring paper of FIG. 5 has been described above, it will be easily understood for those skilled in the art that the transferring paper in FIGS. 3 and 4 can be also manufactured in the same manner.

(2) Mount Paper

As the transfering mount paper, a water-proof paper is used. The thickness is preferably selected to be about 100 to 600 $\mu$m. It is necessary to adjust the thickness and self-standing property of the mount paper in accordance with the constituent elements stacked on the mount paper.

(3) Paste Layer

As the paste layer formed on the mount paper, it is desirable to use an adhesive soluble paste layer. That is, casein, dextrin, starch, glue, poly(vinyl alcohol), polyacrylates, poly(vinyl-pyrrolidone), etc. are used. Dextrin is the most desirable adhesive among them.

(4) Thin metal belt for Conductive Circuit

A thin metal belt is used which is made of a simple substance metal such as copper, aluminum, iron, nickel, chromium, zinc or the like, or an alloy of them. Taking copper as an example of the simple substance metal, as to the thin metal belt, a thin electolytic copper belt is expensive and therefore a thin rolled copper belt is preferable. As to the thin metal belt made of an alloy, a thin rolled belt made of such as stainless steel SUS 304, 316, 430, 444, an alloy of Ni-Cr, an alloy of Cu-P, or the like, may be used (SUS) refers to the stainless steel specifications of the Japanese Industrial Standards). It is preferable to select the thickness of the thin rolled belt within a range from 20 to 200 $\mu$m, and, particularly, within a range from 20 to 120 $\mu$m. If the thickness of the thin rolled belt is thicker than 200 $\mu$m, the tension of elasticity of the thin film becomes stronger than the elasticity of the transferring mount paper, resulting in deterioration in workability. Besides, if the thickness of the thin film is thinner than 20 $\mu$m, the workability becomes poor.

(5) Insulating Layer

Glass is used as a material for forming the insulating layer. Here, glass frit for enamel will be specifically described.

Because the insulating layer is directly influenced by the materials of the substrate and the circuit, the coefficient of thermal expansion of the material of each of the substrate and the circuit and the coefficient of the thermal expansion of the glass frit used as the insulating layer must be matched with each other.

Table 1 shows various kinds of typical insulating glass usable in the present invention with respect to the kind, the range of composition, and the coefficient of thermal expansion thereof, and the firing temperature for forming the insulating layer, and Table 2 shows various kinds of typical insulating glass with respect to the composition, and the coefficient of thermal expansion thereof, and the firing temperature for forming the insulating layer.

Particularly, a glass containing $TiO_3$ deposits fine crystals of $TiO_2$ when it is used for forming an enamel layer. A large number of crystals of $TiO_2$ of 0.12 to 0.2 $\mu m$ in size are deposited in the enamel layer to exhibit an effect of preventing alkali ions comprised in the glass from moving, and therefore the enamel layer is superior in insulating property.

TABLE 1

| Ingredients | Milky Frit | Transparent Frit A | Transparent Frit B |
|---|---|---|---|
| $SiO_2$ | 30–40% by weight | 31–39% by weight | 35–45% by weight |
| $B_2O_3$ | 15–20% by weight | 13–22% by weight | 15–25% by weight |
| $Na_2O$ | 7–9% by weight | 14–22% by weight | 0–8% by weight |
| $K_2O$ | 7–15% by weight | 1–5% by weight | 1–8% by weight |
| CaO | 0–5% by weight | — | 5–15% by weight |
| BaO | 0–5% by weight | — | 1–7% by weight |
| ZnO | — | 13–20% by weight | 0–5% by weight |
| MgO | — | — | 1–4% by weight |
| $Al_2O_3$ | 0–3% by weight | 0–5% by weight | 1–3% by weight |
| $ZrO_2$ | 5–10% by weight | 0–5% by weight | 1–3% by weight |
| $TiO_2$ | 10–17% by weight | 0–5% by weight | — |
| $P_2O_5$ | 0.5–2.5% by weight | — | — |
| $F_2$ | 2–10% by weight | 2–10% by weight | — |
| Coefficient of thermal expansion ($\times 10^7 \cdot deg^{-1}$) | 90–110 | 100–130 | 85–100 |
| Firing Temperature (°C.) | 650–720 | 630–710 | 750–850 |

TABLE 2

| | Frit No. | | | |
|---|---|---|---|---|
| Ingredients | 1 | 2 | 3 | 4 |
| $SiO_2$ | 34% by weight | 35% by weight | 38% by weight | 37% by weight |
| $B_2O_3$ | 17% by weight | 17% by weight | 16% by weight | 15% by weight |
| $Na_2O$ | 9% by weight | 19% by weight | 7% by weight | 7% by weight |
| $K_2O$ | 10% by weight | 2% by weight | 8% by weight | 12% by weight |
| BaO | — | — | 6% by weight | 3% by weight |
| CaO | 1% by weight | — | 11% by weight | 3% by weight |
| ZnO | — | 16% by weight | 6% by weight | — |
| MgO | — | — | 3% by weight | — |
| $Al_2O_3$ | — | 3% by weight | 3% by weight | 2% by weight |
| $ZrO_2$ | 8% by weight | 2% by weight | 2% by weight | — |
| $TiO_2$ | 12% by weight | — | — | 15% by weight |
| $P_2O_5$ | 2% by weight | — | — | 2% by weight |
| $F_2$ | 7% by weight | 6% by weight | — | 4% by weight |
| Coefficient of thermal expansion ($\times 10^7 \cdot deg^{-1}$) | 100 | 115 | 90 | 89 |
| Firing Temperature (°C.) | 700 | 690 | 800 | 780 |

In a preferred embodiment of the present invention, the material for forming the insulating layer is prepared in the form of paste, and the insulating layer is provided with the paste material by screen-printing.

In the case of the above-mentioned glass frit, glass powder having particle size passing through a sieve of 325 mesh is mixed with drying oil, a solvent, a dry suppressing agent, and a surface active agent in the ratio shown in Table 3, sufficiently kneaded by a kneader, processed into the form of paste, and then used.

TABLE 3

| Glass powder | 50 portions |
|---|---|
| Drying oil (squeegee oil) | 45 portions |
| Solvent | 3 portions |
| Dry suppressing agent | 3 portions |
| Surface active agent (Flowability adjustment) | small quantity |

It is preferable to dry the thus provided insulating layer for a long time at a relatively low temperature of 25° to 65° C. It is possible to dry the layer at 30°–65° C. in the case where the thickness of the layer is about 50 to 100 $\mu m$, while it is preferable to dry the layer at a low temperature of about 25°–45° C. in the case where the layer having thickness of about 100 to 300 $\mu m$. Thus, a desirable transferring paper can be obtained without being bent.

(6) Overcoat Layer

It is extremely important for the resin film to perform a role of an overcoat layer. When the transferring paper is soaked in water before use, the paste layer capable of becoming moist again absorbs the water, expands, and becomes wet, so that the mount paper and the transferring section are separated from each other. At this time, it is necessary to maintain flexibility and mechanical strength of the transferring section until the transferring section has been transferred onto and bonded with the aimed substrate. This role is performed by the resin film. Further, the resin film is required to have also a characteristic that it burnt out by being oxidized without remaining ashes through the step of firing or the like when the resin film bonds the transferring section onto the substrate.

Accordingly, the resin film used here must be good in burning property and must not give a bad influence to the vitreous enamel layer as well as the conductive foil. For example, acrylic resin and vinyl chloride resin are used for the resin film. As the acrylic resin, esters of polymethacrylate or esters of polyacrylate may be used. Further, a copolymer of vinyl chloride and acrylic ester may also be used.

The above-mentioned resin is dissolved in a suitable solvent so as to adjust its viscosity, and the resin film is formed by spraying or printing.

Preferred Examples according to the present invention will be described hereunder, while the present invention is not limited only by the examples.

EXAMPLE 1

Figure 6:
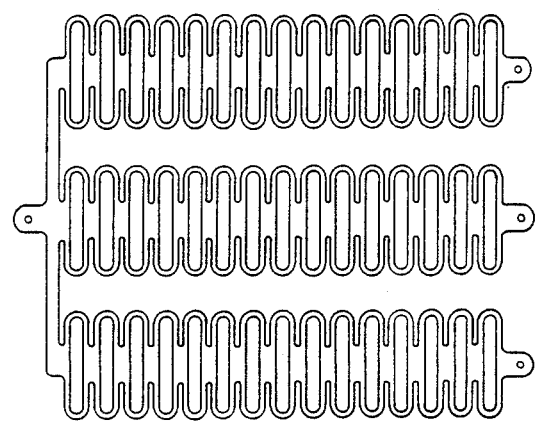
FIGS. 6 and 7 are plan views showing examples of the conductive circuit patterns.

Paste made by adding water to dextrin was applied on a transferring mount paper to about 10 μm thickness by screen-printing and then dried. Then, a conductive foil made by punching stainless steel SUS 430 of about 60 μm thickness into a pattern shown in FIG. 6 was put on the paste layer. Glass paste was applied over the conductive foil by screen-printing to form an insulating layer of about 120 μm thickness. After drying, a solution of acrylic resin in an organic solvent, sold by Mitsubishi Rayon Co., Ltd., under the trade name LR-758N, was screen-printed so as to make the film to about 10 μm thickness and then dried.

As the above-mentioned glass-paste, the frit of No. 1 in Table 2 was employed and prepared into paste with the composition shown in Table 3.

The thus obtained transferring paper having such an arrangement as shown in FIG. 3 was soaked in water. The transferring section separated at the paste layer was set on a substrate, dried, and then burnt at 79° C. for 5 minutes. The substrate used here was obtained by coating an enameled steel substrate with an enamel layer. The thus obtained plate heating unit never produced any bubbles in the insulating layer coating over the outer surface of the heating element consisting of the conductive foil, and showed substantially the same characteristics as those obtained by the conventional method.

EXAMPLE 2

A plate heating unit was produced under the same conditions as those in Example 1 except for the use of the transferring paper arranged as shown in FIG. 5 in which an insulating layer forming material layer using the same glass paste as that described above was formed to about 100 μm thickness between the paste layer and conductive foil.

EXAMPLE 3

A plate heating unit was produced under the same conditions as those in Example 1 except that the conductive foil in Example 1 was replaced by an alloy of Ni-Cr of about 40 μm thickness.

EXAMPLE 4

Figure 7:
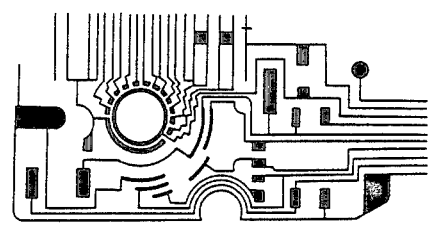

A paste layer using dextrin was formed on a transferring mount paper to about 10 μm thickness, and dried. Then, the same glass paste as that used in Example 1 was screen-printed on the paste layer to about 100 μm thickness and dried. Rolled copper foil punched by a press into such a pattern as shown in FIG. 7 was put on the glass layer, and a resin film of about 10 μm thickness was formed over the rolled copper foil by using the same solution of acrylic resin as that used in Example 1 and dried.

On the other hand, stainless steel SUS 444 was used as a substrate. A transferring section removed from the mount paper was set on the surface of the substrate, dried, and then fired at 790° C., for 45 minutes. At that time the firing was performed in an electric furnace at an atmosphere where mixed gases of 95% by volume of nitrogen and 5% by volume of hydrogen were caused to flow, the concentration of oxygen in the furnace being 2 to 3%.

As described above, the reason why the burning atmosphere was made substantially non-oxidizing was to prevent the copper foil from being oxidized. Oxygen was, however, required at an extent to be able to burn out the resin film.

EXAMPLE 5

A circuit board was produced under the same conditions as those in Example 4 except for the use of enameled stainless steel SUS 444 as a substrate.

The circuit board in Examples 4 and 5 were operated stably when used in an electronic camera.

INDUSTRIAL UTILITY

According to the present invention, it is possible to set stably conductive foil carrying a predetermined circuit pattern on a substrate by a transferring method, and therefore it becomes easy to produce a circuit board. The conductive circuit obtained according to the present invention can be used to conduct a large current as well as a micro-current and therefore can be used for in various kinds of electronic apparatuses or and can be used in the form of a sheet-like heating unit.

What is claimed is:

1. A method of forming an electrically conductive circuit comprising the steps of:
   preparing a transferring paper in which an assembly of electrically conductive foil carrying a predetermined pattern and an insulating layer containing glass frit and an overcoat layer consisting of a resin film having good burning property are provided on a transferring mount paper covered with soluble paste layer;
   removing an integral structure of said assembly of said conductive foil, said insulating layer, and said overcoat layer from said transferring paper;
   setting the removed integral structure onto a substrate;
   firing said substrate with said integral structure set thereon to burn out said resin film and simultaneously soften the glass in said insulating layer, to form a vitreous enamel insulating layer to thereby fix said conductive foil to said substrate.

2. A method of forming an electrically conductive circuit according to claim 1, in which said insulating layer is formed between said paste layer and said conductive foil.

3. A method of forming an electrically conductive circuit according to claim 1, in which said insulating layer is formed between said conductive foil and said overcoat layer.

4. A method of forming an electrically conductive circuit according to claim 1, in which said insulating layer is formed between said paste layer and said conductive foil and between said conductive foil and said overcoat layer.

5. A method of forming an electrically conductive circuit according to claim 2 or 4, in which said substrate is a metal substrate or an enameled metal substrate.

6. A method of forming an electrically conductive circuit according to claim 3, in which said substrate is an enameled metal substrate.

7. A method of forming an electrically conductive circuit according to claim 1, in which said paste layer is a soluble paste layer.

8. A method of forming an electrically conductive circuit comprising the steps of:

preparing a transferring paper in which an electrically conductive foil carrying a predetermined pattern, an insulating layer containing glass frit, and an overcoat layer consisting of a resin film having good burning property are provided one on one on a transferring mount paper covered with soluble paste layer;

removing an integral structure of said conductive foil, said insulating layer, and said overcoat layer from said transferring paper;

setting the removed integral structure onto a substrate;

firing said substrate with said integral structure set thereon to burn out said resin film and simultaneously soften the glass in said insulating layer forming material layer to form a vitreous enamel insulating layer to thereby fix said conductive foil to said subtrate.

9. A method of forming an electrically conductive circuit comprising the steps of:

preparing a transferring paper in which an insulating layer containing glass frit, an electrically conductive foil carrying a predetermined pattern, and an overcoat layer consisting of a resin film having good burning property are provided one on one on a transferring mount paper covered with soluble paste layer;

removing an integral structure of said insulating layer, said conductive foil, and said overcoat layer from said transferring paper;

setting the removed integral structure onto a substrate;

burning said substrate with said integral structure set thereon to soften the glass in said insulating layer to form a vitreous enamel insulating layer.

10. A method of forming an electrically conductive circuit comprising the steps of:

preparing a transferring paper in which a first insulating layer containing glass frit, an electrically conductive foil carrying a predetermined pattern, a second insulating layer containing glass frit, and an overcoat layer consisting of a resin film having good burning property are provided one on one on a transferring mount paper covered with soluble paste layer;

removing an integral structure of said first and second insulating layer, said conductive foil, and said overcoat layer from said transferring paper;

setting the removed integral structure onto a substrate;

firing said substrate with said integral structure set thereon to soften the glass in said first and second insulating layer to form a vitreous enamel insulating layer.

* * * * *